(12) United States Patent
Franch et al.

(10) Patent No.: US 10,145,892 B2
(45) Date of Patent: Dec. 4, 2018

(54) INCREASING THE RESOLUTION OF ON-CHIP MEASUREMENT CIRCUITS

(71) Applicant: International Business Machines Corporation, Armonk, NY (US)

(72) Inventors: Robert L. Franch, Wappingers Falls, NY (US); Phillip J. Restle, Katonah, NY (US); Thomas Strach, Wildberg (DE); Christos Vezyrtzis, New York, NY (US); Scott F. Warnock, Portland, OR (US)

(73) Assignees: INTERNATIONAL BUSINESS MACHINES CORPORATION, Armonk, NY (US); COMPUTER TASK GROUP, INC., Buffalo, NY (US)

( * ) Notice: Subject to any disclaimer, the term of this patent is extended or adjusted under 35 U.S.C. 154(b) by 0 days.

(21) Appl. No.: 15/243,375

(22) Filed: Aug. 22, 2016

(65) Prior Publication Data

US 2018/0052200 A1    Feb. 22, 2018

(51) Int. Cl.
*G01R 31/28*    (2006.01)

(52) U.S. Cl.
CPC ................. *G01R 31/2882* (2013.01)

(58) Field of Classification Search
None
See application file for complete search history.

(56) References Cited

U.S. PATENT DOCUMENTS

| | | | |
|---|---|---|---|
| 7,142,998 B2 | 11/2006 | Watson, Jr. et al. | |
| 7,339,364 B2 * | 3/2008 | Kam | G01R 29/26 324/750.3 |
| 7,400,555 B2 | 7/2008 | Franch et al. | |
| 7,816,960 B2 | 10/2010 | Saint-Laurent et al. | |
| 7,944,229 B2 * | 5/2011 | Joshi | G01R 31/31725 324/750.3 |
| 7,961,559 B2 | 6/2011 | Dixon | |
| 7,973,549 B2 | 7/2011 | Joshi et al. | |
| 2008/0198700 A1 | 8/2008 | Franch et al. | |
| 2008/0246461 A1 * | 10/2008 | Abuhamdeh | G01R 31/31725 324/76.54 |

(Continued)

OTHER PUBLICATIONS

Hu Xu, et al.: "The Combined Effect of Process Variations and Power Supply Noise on Clock Skew and Jitter"; 13th Int'l Symposium on Quality Electronic Design; IEEE; 978-1-4673-1036; 2012; pp. 8.

(Continued)

*Primary Examiner* — Jermele M Hollington
*Assistant Examiner* — Douglas X Rodriguez
(74) *Attorney, Agent, or Firm* — Cantor Colburn LLP; Margaret A. McNamara

(57) ABSTRACT

A method for increasing a resolution of an on-chip measurement circuit is provided. The method includes propagating a first signal through the on-chip measurement circuit to generate a first output. The method also includes propagating a second signal through the on-chip measurement circuit to generate a second output. The second signal includes a delay. The method also includes reconciling the first output and the second output to determine the resolution of the on-chip measurement circuit. The resolution of the on-chip measurement circuit increases in correspondence with a fineness of a step of the delay.

16 Claims, 5 Drawing Sheets

(56) References Cited

U.S. PATENT DOCUMENTS

2008/0265957 A1* 10/2008 Luong .................... H03L 7/089
                                                        327/156
2008/0309364 A1* 12/2008 Joshi ................ G01R 31/31725
                                                        324/750.02
2012/0134403 A1    5/2012 Kam et al.

OTHER PUBLICATIONS

K, Nose, et al.; "A 1-PS Resolution Jitter-Measurement Macro Using Interpolated Jitter Oversampling"; Solid-State Circuits, IEEE Journal of (vol. 41, Issue: 12); pp. 2911-2920.

K. A. Jenkins,; "On-chip circuit technique for measuring jitter and skew with picosecond resolution"; DOI: 101007/978-90-481-9379-0_15; Dec. 2009; pp. 3.

Robert Franch, et al.; "On-chip Timing Uncertainty Measurements on IBM Microprocessors"; IEEE 1-4244-1128; 2007; pp. 7.

* cited by examiner 310 320 330

INCREASING THE RESOLUTION OF ON-CHIP MEASUREMENT CIRCUITS

BACKGROUND

In general, contemporary on-chip measurement circuits have a crude accuracy limited by a timing through a single inverter chain. The timing through the single inverter chain comprises a propagation time from one latch to the next latch when performing measurements. The crude accuracy results from picosecond resolution of the propagation time, which can be on the order of 5 to 8 picoseconds.

An attempt to address this crude accuracy includes modifying an on-chip measurement internal voltage in steps of approximately 1 mV to provide a precise timing measurement solution. However, this is only a viable solution for power noise measurements when the on-chip measurement internal voltage is what needs to be measured. In all other scenarios, modifying the on-chip measurement internal voltage is not a viable option because it is not possible to change a processor voltage for measurement purposes (e.g. in a customer environment).

At present, there is a need for alternative precise timing measurement solutions to address the crude accuracy of the contemporary on-chip measurement circuits.

SUMMARY

According to one embodiment, a method for increasing a resolution of an on-chip measurement circuit is provided. The method comprises propagating a first signal through the on-chip measurement circuit to generate a first output; propagating a second signal through the on-chip measurement circuit to generate a second output, wherein the second signal includes a delay; and reconciling the first output and the second output to determine the resolution of the on-chip measurement circuit, wherein the resolution of the on-chip measurement circuit increases in correspondence with a fineness of a step of the delay. According to another embodiment, the method can be implemented as a system.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

The disclosure relates generally to increasing a resolution of an on-chip measurement circuit, and more particularly, to increasing a resolution of an on-chip measurement circuit that is measuring a processor clock. The on-chip measurement circuit (a.k.a. a Skitter circuit) can measure a processor clock by capturing a processor clock signal in a processor register. As indicated above, the measurement of the processor clock can be limited by a picosecond resolution, which is more or less a propagation time one latch of the on-chip measurement circuit to the next latch.

Embodiments disclosed herein may include a system and/or a method for increasing the resolution of the on-chip measurement circuit by enhancing the on-chip measurement circuit with an inclusion of a programmable delay at a start of a circuit delay chain. The programmable delay is smaller than a delay of each stage of the circuit delay chain (e.g., the propagation time one latch to the next latch). And because the programmable delay is smaller than the delay of each stage, the resolution of the circuit delay chain increases with respect to a fineness of a step of the programmable delay. The increased resolution can more accurately measure the processor clock.

Figure 1:
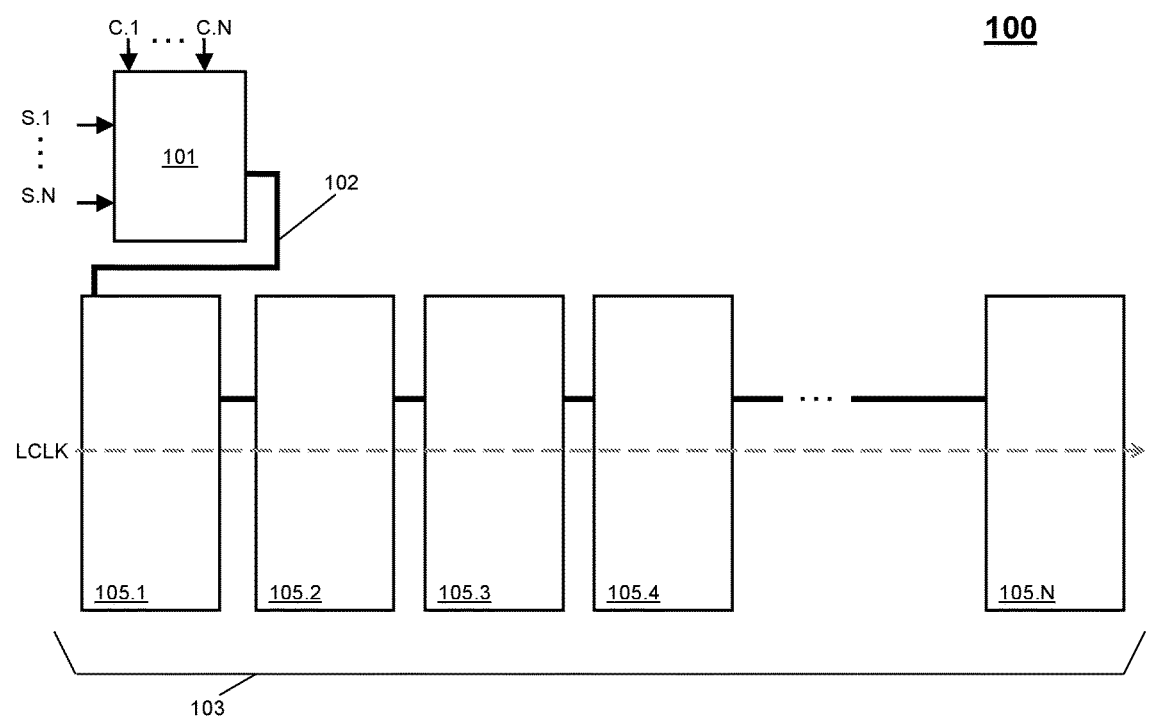
FIG. 1 illustrates a schematic of an on-chip measurement circuit in accordance with an embodiment.

FIG. 1 illustrates a schematic of an on-chip measurement circuit 100 in accordance with an embodiment. The on-chip measurement circuit 100 includes a first circuit 101, an input 102, a circuit delay chain 103 comprising a plurality of second circuits 105.1 to 105.N (where N is an integer greater than 1), one or more input signals S.1 to S.N, one or more control signals C.1 to C.N, and a latch clock LCLK.

The first circuit 101 can be any programmable circuit configured to implement a delay on the one or more input signals S.1 to S.N being passed to the input 102 and through the circuit delay chain 103. In an embodiment, the first circuit is a tunable delay element located in front of a multiplexing input of the circuit delay chain 103 and capable of producing at least one delays that are all smaller than the delay caused by a single inverter of the circuit delay chain 103.

The input 102 is the wire that carries the one or more input signals S.1 to S.N from the first circuit 101 to the circuit delay chain 103 and each of the plurality of second circuits 105.1 to 105.N (i.e., through the circuit delay chain 103), where each of the second circuits 105.1 to 105.N is a stage along the circuit delay chain. Note that the plurality of second circuits 105.1 to 105.N can be a series of identical gates (e.g., inverters and latches/flip-flops).

The on-chip measurement circuit 100 can be referred to as a Skitter circuit. The circuit delay chain 103 can be referred to as a delay line, a circuit delay line, a Skitter delay line, a skitter-latch delay line, or a latched tapped delay line. The circuit delay chain 103 can also be referred to as a Skitter delay chain or a Skitter inverter chain.

The operations of the first circuit 101 can be controlled by the one or more control signals C.1 to C.N. The operations of the circuit delay chain 103 and the plurality of second circuits 105.1 to 105.N can be controlled by the latch clock LCLK. The one or more input signals S.1 to S.N represent signals of the feature being measured (e.g., the on-chip measurement circuit 100 can perform a digital time measurement or power/noise measurement).

In an embodiment, the one or more control signals C.1 to C.N can be utilized to program the first circuit 101 with the delay. For example, the one or more control signals C.1 to C.N can be utilized to select from a plurality of delay circuits, each of which include a specific delay value. In another example, the one or more control signals C.1 to C.N set a specific delay value within the first circuit. In operation, the delay or specific delay value can be selected from a range comprising an upper bound of the propagation delay.

Figure 2:
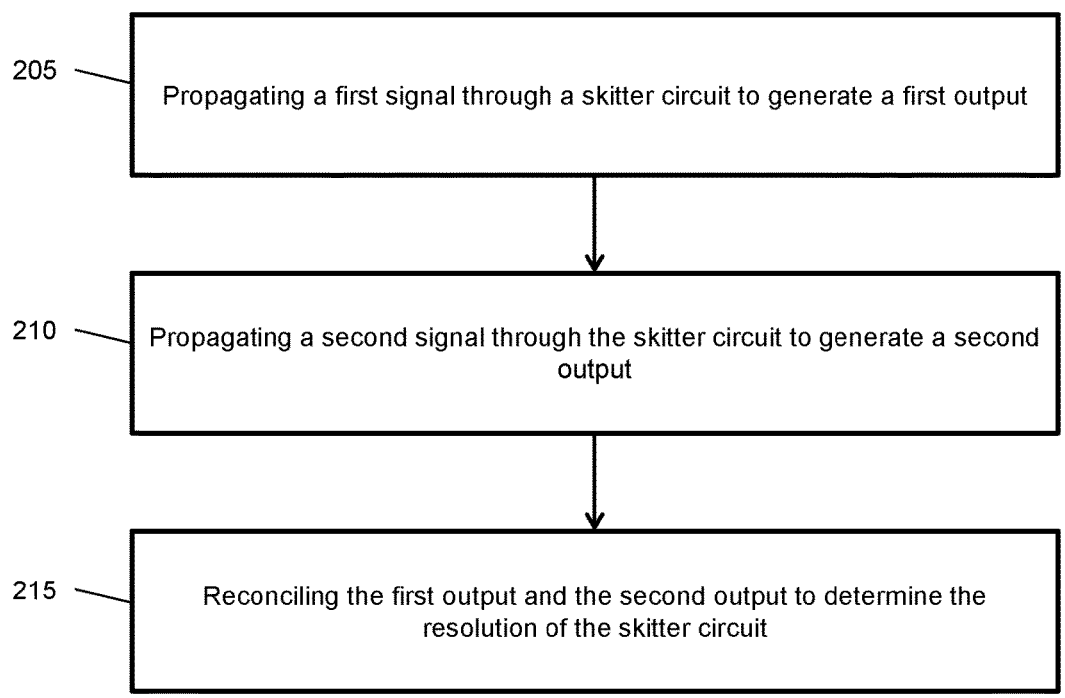
FIG. 2 illustrates a process flow for increasing a resolution of an on-chip measurement circuit in accordance with an embodiment.

Turning now to FIG. 2, a process flow 200 for increasing a resolution of the on-chip measurement circuit 100 is shown in accordance with an embodiment. The process flow 200 begins at block 205, where a first signal is propagated through the on-chip measurement circuit 100 to generate a first output. The first signal can be propagated to the input 102 through the circuit delay chain 103. As each stage of the circuit delay chain 103 receives the first signal, that stage can queue, store, and/or output a value specific to that stage. The value can be a Boolean value, such as a 0 or 1.

For instance, as the first signal propagates through the on-chip measurement circuit 100, the value of each stage remains the same as the previous stage until a measurement is taken. The stage at which the measurement is taken, the Boolean values transition (e.g., a 0-1 transition). This transition can be referred to as an original transition. These values (or collection thereof) comprise the first output. The first output can be stored by the on-chip measurement circuit 100 or passed onto a processor in communication with the on-chip measurement circuit 100.

At block 210, a second signal is propagated through the on-chip measurement circuit to generate a second output. The second signal includes a delay.

The delay can be a programmable delay, such that a fineness of a step of the delay can be altered (increased/decreased) based on a desired resolution. The delay is at a start of the circuit delay chain 103. A step of this programmable delay is smaller than a delay of each of the plurality of second circuits 105.1 to 105.N. Similar to block 205, each stage can queue, store, and/or output a value specific to that stage as that stage receives the second signal. The stage at which the measurement is taken, the Boolean values transition (e.g., a 0-1 transition). This transition can be referred to as a delayed transition.

These values (or collection thereof) comprise the second output. The second output can be stored by the on-chip measurement circuit 100 or passed onto a processor in communication with the on-chip measurement circuit 100.

The second signal, which includes the delay, can be propagated to the input 102 through the circuit delay chain 103. As each stage of the circuit delay chain 103 receives the second signal, that stage can store or output a value a state specific to that stage. The stored or outputted values comprise to make the second output. The second output can be stored by the on-chip measurement circuit 100 or passed on to a processor in communication with the on-chip measurement circuit 100.

At block 215, the first output and the second output are reconciled to determine the resolution of the on-chip measurement circuit 100. For instance, the first and second outputs can be passed along to the processor. The processor makes a comparison as to which stages the original and delay transitions occurred.

If the programmable delay is made big (e.g., greater than half the interval) and the delayed transition is at a same stage (or "bin") as the original transition, then the original transition originally was middle to late in that stage. If the programmable delay is made small (e.g., less than half the interval) and the delayed transition moves to a next stage (or "bin"), then the original transition originally was early to the middle in an original stage.

If the programmable delay is at half the interval and the delayed transition is at a same stage (or "bin") as the original transition, then the original transition originally was in a second half of that stage. If the programmable delay is programmed at half the interval and the delayed transition moves to a next stage (or "bin"), then the original transition originally was in a first half of the original stage. In this way, the resolution of the on-chip measurement circuit 100 increases in correspondence with the delay.

Note that the processor can collect a plurality of outputs (e.g., readings for different settings of the first circuit) and computes a fine resolution result from the plurality of outputs. In an embodiment, the processor can execute a program or software (in the form of a computer program product) to collect the plurality of outputs and compute the fine resolution result, such that an iterative delay line change of weights can be easily performed with a higher accuracy of the measurement. The computer program product may include a computer readable storage medium (or media) having computer readable program instructions thereon for causing a processor to carry out aspects of the embodiments herein.

In view of the above, by sweeping the delay in the on-chip measurement circuit 100, an increase resolution of the on-chip measurement circuit 100 can be achieved by a factor 2× to 4× from the resolution of the contemporary on-chip measurement circuits.

Figure 3:
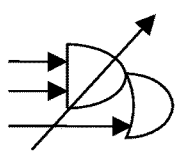
FIG. 3 illustrates a set of schematics of a first circuit of an on-chip measurement circuit in accordance with an embodiment.
Figure 3:
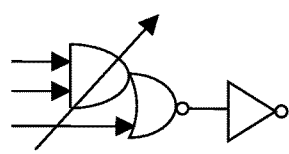
Figure 3:
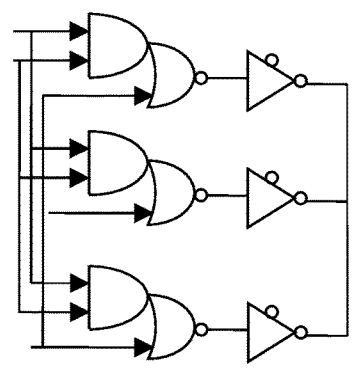

FIG. 3 illustrates a set of schematics 310, 320, 330 of the first circuit 101 of the on-chip measurement circuit 100 in accordance with an embodiment. The schematics 310 and 320 illustrate examples of a portion of the first circuit 101, where the delay can be implemented as multiple parallel copies of the same gate, with "enable" signals for each. That is, as the control signals change, a drive strength (and hence the delay as well) of the gate changes. The schematic 330 illustrates an example the schematic 320 arranged in three parallel settings with the inverters being tri-state inverters.

Figure 4:
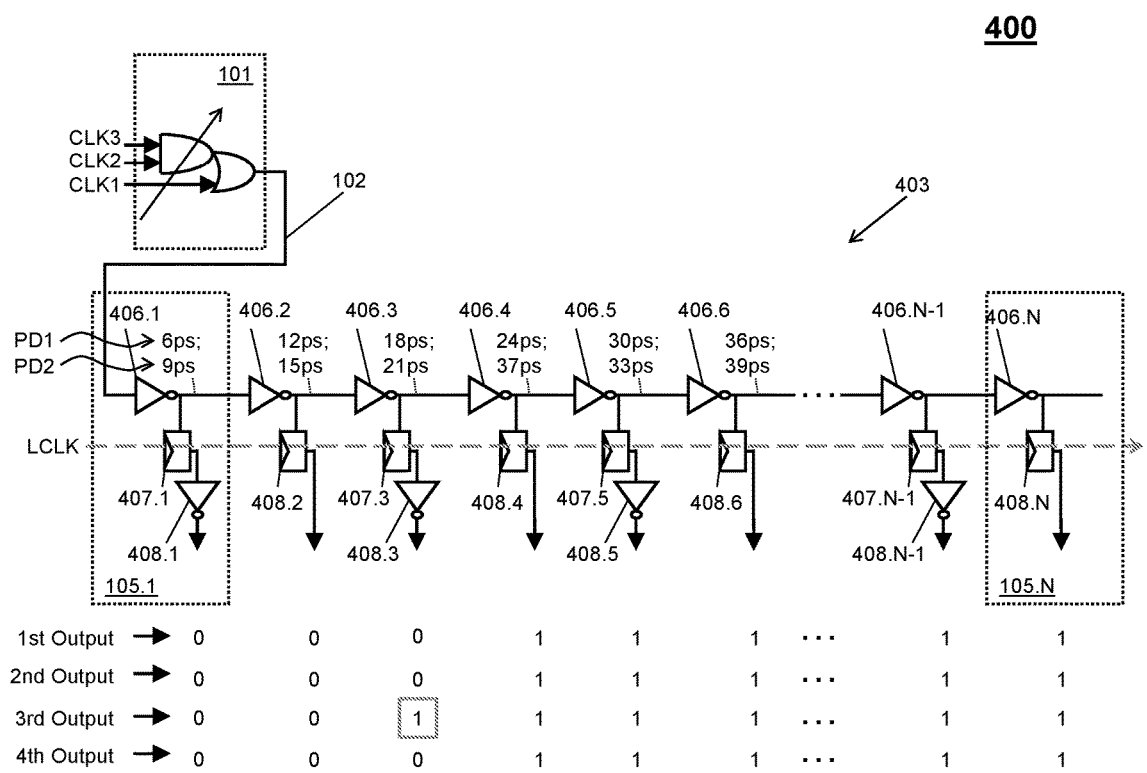
FIG. 4 illustrates another schematic of an on-chip measurement circuit in accordance with an embodiment.

Turning now to FIG. 4, an on-chip measurement circuit 400 is shown in accordance with an embodiment. The on-chip measurement circuit 400 includes a gate level diagram of the on-chip measurement circuit 400. The gate level diagram illustrates the first circuit 101 comprising a programmable AND/OR gate that receives and passes three clock signals CLK1, CLK2, and CLK3 to the circuit delay chain 403 when the feature being measured is a processor clock. The gate level diagram also illustrates the plurality of second circuits 105.1 to 105.N to include a series of identical gates, such as inverters 406.1 to 406.N. Further, a pair of respective latches 407.1 to 407.N and inverters 408.1 to 408.N are located after each inverter 406.1 to 406.N. Each latch 407.1 to 407.N taps the circuit delay chain 103 for a value of at that location within the circuit delay chain 103.

In a first measurement operation, an input is selected, such as the first input described above. That is, the first input does not include a delay implemented by the programmable AND/OR gate. Thus, the propagation time PD1 respective to each inverter 406.1 to 406.N is at 6 picoseconds intervals, each interval defining a time that the first input is resident within that corresponding stage.

Then, the first measurement operation begins when the latch clock signal LCLK pulses (a first pulse) to enable the latches 407.1 to 407.N and when the selected input passes through the first circuit 101 to begin propagating through the inverters 406.1 to 406.N (this is a simultaneous action).

Next, the latch clock signal LCLK pulses (a second pulse) to enable the latches 407.1 to 407.N to capture the state of the inverters 406.1 to 406.N. The second pulse can be triggered at a designated time for capturing a measurement.

This first operation can be executed multiple times. In the example of FIG. 4, the first operation is executed twice, where the second pulse is triggered at 19 picoseconds after the first pulse and at 23 picoseconds after the first pulse. As shown in FIG. 4, the second pulse at 19 picoseconds renders a 1st output, and the second pulse at 23 picoseconds renders a 2nd Output. Note that in both the 1st and 2nd Outputs, a delayed transition of the first input remained in the same stage (i.e., the fourth bin with respect to inverter 406.4), as indicated by the three leading 0s of latches 408.1, 408.2, and 408.3. This delayed transition can be referred to as an original transition of the first input, respective to 19 and 23 picosecond pulses.

In a second measurement operation, an input is selected, such as the second input described above. That is, the second input includes a delay implemented by the programmable AND/OR gate. In this second operation, the example delay is 3 picoseconds. Thus, while the propagation time PD2 respective to each inverter 406.1 to 406.N is still at 6 picoseconds intervals, each interval defining a time that the second input is resident within that corresponding stage is delayed by 3 picoseconds.

Then, the second measurement operation begins when the latch clock signal LCLK pulses (a first pulse) to enable the latches 407.1 to 407.N and when the selected input passes through the first circuit 101 to begin propagating through the inverters 406.1 to 406.N (this is a simultaneous action). Next, the latch clock signal LCLK pulses (a second pulse) to enable the latches 407.1 to 407.N to capture the state of the inverters 406.1 to 406.N. The second pulse can be triggered at a designated time for capturing a measurement.

This second operation can be executed multiple times. In the example of FIG. 4, the second operation is executed twice, where the second pulse is triggered at 19 picoseconds after the first pulse and at 23 picoseconds after the first pulse (same as the first measurement operation). As shown in FIG. 4, the second pulse at 19 picoseconds renders a 3rd output, and the second pulse at 23 picoseconds renders a 4th Output.

Note that in the 3rd Output, because the second input respective to the 19 picosecond pulse was delayed by 3 picoseconds, a delayed transition of the second input was detected in the third stage (i.e., the third bin with respect to inverter 406.3), as indicated by the three leading 0s of latches 408.1 and 408.2. Because this delayed transition of the second input respective to the 19 picosecond pulse moved to the third stage (or "bin"), then the original transition of the first input respective to the 19 picosecond pulse occurred in a first half of the fourth stage.

Note that in the 4th Output, while the second input respective to the 23 picosecond pulse was delayed by 3 picoseconds, the second input remained in the same stage as the first input respective to the 23 picosecond pulse (i.e., the fourth bin with respect to inverter 406.4), as indicated by the three leading 0 s of latches 408.1, 408.2, and 408.3. Because this delayed transition of the second input respective to the 23 picosecond pulse stayed at a same stage (or "bin") as the original transition of the first input respective to the 23 picosecond pulse, then the original transition of the first input respective to the 23 picosecond pulse occurred in a second half of the fourth stage.

Figure 5:
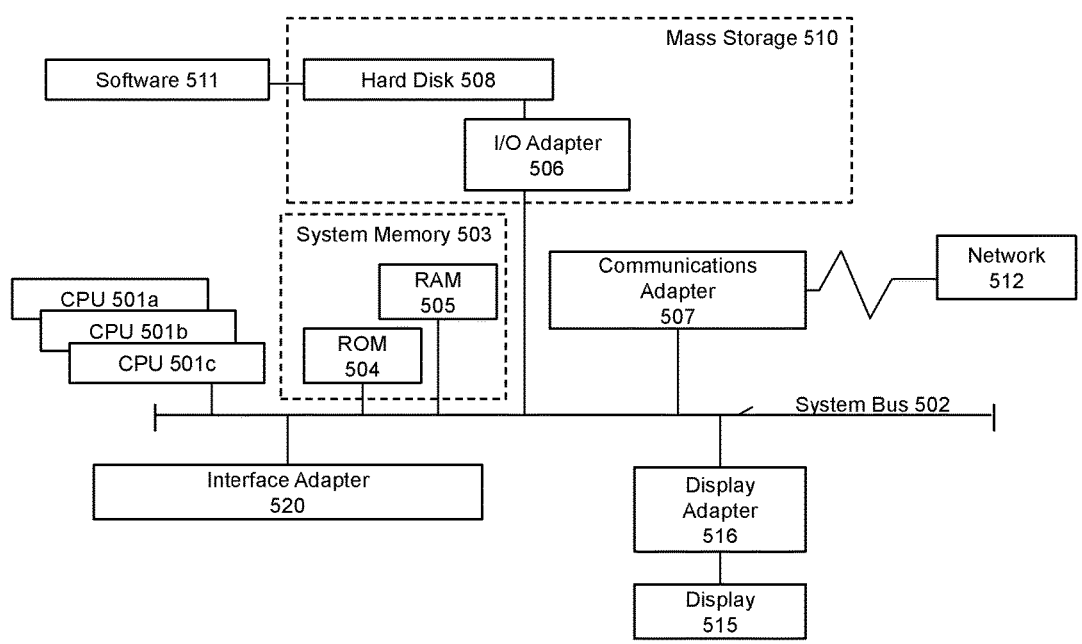
FIG. 5 illustrates a processing system in accordance with an embodiment.

Referring now to FIG. 5, there is shown an embodiment of a processing system 500 for implementing the teachings herein. In this embodiment, the processing system 500 has one or more central processing units (processors) 501a, 501b, 501c, etc. (collectively or generically referred to as processor(s) 501), each of which can include an on-chip measurement circuit (e.g., the on-chip measurement circuits 100 of FIG. 1 or 400 of FIG. 4). The processors 501, also referred to as processing circuits, are coupled via a system bus 502 to a system memory 503 and various other components (such as the on-chip measurement circuits 100 of FIG. 1 or 400 of FIG. 4). The system memory 503 can include read only memory (ROM) 504 and random access memory (RAM) 505. The ROM 504 is coupled to system bus 502 and may include a basic input/output system (BIOS), which controls certain basic functions of the processing system 500. RAM 505 is read-write memory coupled to system bus 502 for use by the processors 501.

FIG. 5 further depicts an input/output (I/O) adapter 506 and a communications adapter 507 coupled to the system bus 502. I/O adapter 506 may be a small computer system interface (SCSI) adapter that communicates with a hard disk 508 and/or any other similar component. I/O adapter 506 and hard disk 508 are collectively referred to herein as mass storage 510. Software 511 for execution on the processing system 500 may be stored in mass storage 510. The mass storage 510 is an example of a tangible storage medium readable by the processors 501, where the software 511 is stored as instructions for execution by the processors 501 to perform a method, such as the process flows of FIG. 2. Communications adapter 507 interconnects the system bus 502 with an outside network 512 enabling processing system 500 to communicate with other such systems. A display 515 is connected to system bus 502 via a display adapter 516, which may include a graphics controller to improve the performance of graphics intensive applications and a video controller. In one embodiment, adapters 506, 507, and 516 may be connected to one or more I/O buses that are connected to the system bus 502 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices can be connected to the system bus 502 via an interface adapter 520 and the display adapter 516. A keyboard, mouse, speaker can be interconnected to the system bus 502 via the interface adapter 520, which may include, for example, a Super I/O chip integrating multiple device adapters into a single integrated circuit.

Thus, as configured in FIG. 5, the processing system 505 includes processing capability in the form of processors 501, and, storage capability including the system memory 503 and the mass storage 510, input means such as keyboard and mouse, and output capability including speaker and the display 515. In one embodiment, a portion of the system memory 503 and the mass storage 510 collectively store an operating system, such as the z/OS or AIX operating system from IBM Corporation, to coordinate the functions of the various components shown in FIG. 5.

Technical effects and benefits include an innovative enhancement of the on-chip measurement circuits that provides value for medium frequency noise and jitter measurement on a chip. Technical effects and benefits include an improved accuracy by adding a fine delay in front of the on-chip measurement circuits and iteratively swapping through the measurement by adding more weights of the fine delay (e.g., the transition of the circuit output changes based on adding the weights at the beginning of the on-chip measurement circuits), which achieves a higher accuracy than a base delay of a single inverter in a circuit delay chain. Technical effects and benefits include efficient implementation on the chip, such as by adding the fine delay (e.g., increase a fineness of a step of a delay) only once per on-chip measurement circuit and not for each inverter.

Embodiments may include a system and/or a method at any possible technical detail level of integration. The system may include a computer readable storage medium (or media) having computer readable program instructions thereon for causing a processor to carry out aspects of the embodiments herein. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the embodiments herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments herein.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for increasing a resolution of an on-chip measurement circuit comprising a first circuit and a circuit delay chain comprising a plurality of stages, the method comprising:
propagating, by the first circuit of the on-chip measurement circuit, a first signal through the circuit delay chain of the on-chip measurement circuit to generate a first output;
propagating, by the first circuit of the on-chip measurement circuit, a second signal through the circuit delay chain of the on-chip measurement circuit to generate a second output, wherein the second signal includes a delay; and
reconciling the first output and the second output to determine the resolution of the on-chip measurement circuit by a comparison of the first output and the second output at each stage of the plurality of stages within the on-chip measurement circuit to identify at each stage whether an original transition or a delay transition of the first and second signals occurred,
wherein the resolution of the on-chip measurement circuit increases in correspondence with the delay.

2. The method of claim 1, wherein the first circuit comprises a programmable circuit of the on-chip measurement circuit coupled to the circuit delay chain of the on-chip measurement circuit.

3. The method of claim 1, wherein the first circuit comprises one of a plurality of parallel circuits of the on-chip measurement circuit, each of parallel circuit providing a different value for the delay.

4. The method of claim 1, further comprising:
iteratively swapping through a plurality of signals to determine the resolution of the on-chip measurement circuit.

5. The method of claim 4, wherein the plurality of signals comprises at least the first and the second signals.

6. The method of claim 1, wherein the delay of the second signal is less than a delay of each stage of the on-chip measurement circuit.

7. The method of claim 1, wherein the delay of the second signal is a programmable delay at the start of a circuit delay line of the on-chip measurement circuit.

8. A system for increasing a resolution of an on-chip measurement circuit, the system comprising the on-chip measurement circuit, the on-chip measurement circuit comprising a first circuit and a circuit delay chain comprising a plurality of stages, the system being configured to:
propagate, by the first circuit, a first signal through the on-chip measurement circuit to generate a first output;
propagate, by the first circuit, a second signal through the on-chip measurement circuit to generate a second output, wherein the second signal includes a delay; and
reconcile the first output and the second output to determine the resolution of the on-chip measurement circuit by a comparison of the first output and the second output at each stage of the plurality of stages within the on-chip measurement circuit to identify at each stage whether an original transition or a delay transition of the first and second signals occurred,
wherein the resolution of the on-chip measurement circuit increases in correspondence with the delay.

9. The system of claim 8, wherein the first circuit comprises a programmable circuit of the on-chip measurement circuit coupled to a circuit delay chain of the on-chip measurement circuit.

10. The system of claim 8, wherein the first circuit comprises one of a plurality of parallel circuits of the on-chip measurement circuit, each of parallel circuit providing a different value for the delay.

11. The system of claim 8, the system configured to:
iteratively swap through a plurality of signals to determine the resolution of the on-chip measurement circuit.

12. The system of claim 11, wherein the plurality of signals comprises at least the first and the second signals.

13. The system of claim 8, wherein the delay of the second signal is less than a delay of each stage of the on-chip measurement circuit.

14. The system of claim 8, wherein the delay of the second signal is a programmable delay at the start of a circuit delay line of the on-chip measurement circuit.

15. An on-chip measurement circuit comprising:
a circuit delay chain comprising a plurality of stages, the circuit delay chain being configured to receive and propagate a plurality of signals to execute a measurement; and
a programmable device configured to provide the plurality of signals to the circuit delay chain,
wherein the programmable device implements a delay in at least one of the plurality of signals to increase a resolution of the measurement of the circuit delay chain,
wherein the on-chip measurement circuit reconciles the first output and the second output to determine the resolution of the on-chip measurement circuit by a comparison of the first output and the second output at each stage of the plurality of stages within the on-chip measurement circuit to identify at each stage whether an original transition or a delay transition of the first and second signals occurred,
wherein the first and second outputs respectively correspond to first and second signals,
wherein the resolution of the on-chip measurement circuit increases in correspondence with the delay.

16. The on-chip measurement circuit of claim 15, wherein the on-chip measurement circuit is configured to iteratively swap through the plurality of signals to determine the resolution of the on-chip measurement circuit.

* * * * *